(12) United States Patent
Sato

(10) Patent No.: US 11,015,246 B2
(45) Date of Patent: May 25, 2021

(54) APPARATUS AND METHODS FOR DEPOSITING ALD FILMS WITH ENHANCED CHEMICAL EXCHANGE

(71) Applicant: Applied Materials, Inc., Santa Clara, CA (US)

(72) Inventor: Tatsuya E. Sato, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/494,835

(22) Filed: Apr. 24, 2017

(65) Prior Publication Data

US 2017/0321325 A1 Nov. 9, 2017

Related U.S. Application Data

(60) Provisional application No. 62/326,819, filed on Apr. 24, 2016.

(51) Int. Cl.
| | |
|---|---|
| *C23C 16/24* | (2006.01) |
| *C23C 16/455* | (2006.01) |
| *C23C 16/458* | (2006.01) |
| *C23C 16/04* | (2006.01) |

(52) U.S. Cl.
CPC ...... *C23C 16/45544* (2013.01); *C23C 16/045* (2013.01); *C23C 16/458* (2013.01); *C23C 16/45551* (2013.01)

(58) Field of Classification Search
CPC .............. C23C 16/24; C23C 16/45544; C23C 16/45327

See application file for complete search history.

(56) References Cited

U.S. PATENT DOCUMENTS

| | | | |
|---|---|---|---|
| 5,338,362 | A | 8/1994 | Imahashi |
| 5,747,113 | A | 5/1998 | Tsai |
| 6,576,062 | B2 | 6/2003 | Matsuse |
| 8,043,432 | B2 | 10/2011 | Dip |
| 2001/0007244 | A1 | 7/2001 | Matsuse |
| 2009/0143911 | A1 | 6/2009 | Gage et al. |
| 2010/0186669 | A1 | 7/2010 | Shin et al. |
| 2011/0159702 | A1 | 6/2011 | Ohizumi et al. |
| 2011/0290175 | A1 | 12/2011 | Paranjpe et al. |
| 2012/0225191 | A1* | 9/2012 | Yudovsky ......... C23C 16/45527 427/58 |
| 2013/0196507 | A1* | 8/2013 | Ma ..................... H01L 21/76838 438/685 |
| 2015/0252477 | A1* | 9/2015 | Nguyen .................. C23C 16/24 427/569 |
| 2015/0368798 | A1* | 12/2015 | Kwong ............. C23C 16/45544 118/729 |

FOREIGN PATENT DOCUMENTS

| | | |
|---|---|---|
| JP | S58181714 A | 10/1983 |
| WO | 2008100846 A2 | 8/2008 |

* cited by examiner

*Primary Examiner* — Robert M Kunemund
(74) *Attorney, Agent, or Firm* — Servilla Whitney LLC

(57) ABSTRACT

Gas injector units for processing chambers having one or more of scavenging ports, differential pressure ports and variable surfaces for variable injector to substrate gap distances are described. Gas distribution assemblies and processing chambers incorporating the gas injector units are also described.

16 Claims, 7 Drawing Sheets

APPARATUS AND METHODS FOR DEPOSITING ALD FILMS WITH ENHANCED CHEMICAL EXCHANGE

CROSS-REFERENCE TO RELATED APPLICATIONS

This application claims priority to U.S. Provisional Application No. 62/326,819, filed Apr. 24, 2016, the entire disclosure of which is hereby incorporated by reference herein.

TECHNICAL FIELD

The present disclosure relates generally to apparatus and methods of depositing thin films. In particular, the disclosure relates to apparatus and methods for depositing spatial ALD films with enhanced chemical exchange on the wafer surface.

BACKGROUND

In microelectronics device fabrication, there is a need to fill narrow trenches (ARs>10:1) with no voiding for many applications. One such application is shallow trench isolation (STI). In STI, the film needs to be of high quality throughout the trench (i.e., having a wet etch rate ratio less than about 2) with very low leakage.

One of possible solutions is Spatial Atomic Layer Deposition (ALD). Spatial ALD uses a sequence of atomic layer deposition and plasma etch which enables void free fill in trenches at reasonable productivity. Both thermal ALD and plasma enhanced (PE) ALD can be used to provide conformal void free deposition. Spatial ALD processing chambers move a wafer between multiple processing regions containing the various process gases. The surface pressure among the various processing regions is substantially the same and stable. Chemical diffusion into the surface features is driven by pressure and concentration gradients.

Therefore, there is a need in the art for apparatus and methods for spatial ALD that provide a greater driving force to fill the surface features.

SUMMARY

One or more embodiments of the disclosure are directed to gas injector units comprising a first reactive gas port having a depth and width; a first vacuum port surrounding the first reactive gas port, the first vacuum port having a width and depth; a second reactive gas port having a depth and width; a second vacuum port surrounding the second reactive gas port, the vacuum port having a width and depth; a purge gas port between the first vacuum port and the second vacuum port, the first purge gas port having a width and depth; and a scavenging vacuum port between the first vacuum port and the purge gas port, the scavenging vacuum port having a width and depth.

Additional embodiments of the disclosure are directed to processing chambers comprising a gas distribution assembly and a susceptor assembly. The gas distribution assembly comprising a plurality of wedge-shaped gas injector units arranged in a circle. At least one of the wedge-shaped gas injector units comprises a first reactive gas port surrounded by a first vacuum port; a first scavenging vacuum port adjacent the first vacuum port on an opposite side than the first reactive gas port; a second reactive gas port surrounded by a second vacuum port; a second scavenging vacuum port adjacent the second vacuum port on an opposite side than the first reactive gas port; a purge gas port between the first scavenging port and the second reactive gas port; and a purge gas port adjacent the second scavenging vacuum port on a side opposite the second reactive gas port. The susceptor assembly has a top surface with a plurality of recesses therein, the recesses sized to support a substrate.

Further embodiments of the disclosure are directed to processing chambers comprising a gas distribution assembly comprising a plurality of wedge-shaped gas injector units arranged in a circle. At least one of the wedge-shaped gas injector units comprises a front surface; a first reactive gas port surrounded by a first vacuum port; a second reactive gas port surrounded by a second vacuum port; a purge gas port between the first vacuum port and the second vacuum port; and a purge gas port adjacent the second vacuum port on a side opposite the second reactive gas port. The susceptor assembly has a top surface with a plurality of recesses therein. The recesses are sized to support a substrate. The susceptor assembly is movable to form a gap between the top surface and the front surface. The gaps between the top surface and the front surface adjacent the first vacuum port and the second vacuum port is less than the gap between the top surface and the front surface adjacent the purge gas ports.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only representative embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Some embodiments of the disclosure are directed to processes that use a reaction chamber with multiple gas ports that can be used for introduction of different chemicals or plasma gases. Spatially, these gas ports (also referred to as channels) are separated by inert purging gases and/or vacuum pumping holes to create a gas curtain that minimizes or eliminates mixing of gases from different gas ports to avoid unwanted gas phase reactions. Wafers moving through these different spatially separated ports get sequential and multiple surface exposures to different chemical or plasma environment so that layer by layer film growth in spatial ALD mode or surface etching process occur. In some embodiments, the processing chamber has modular architectures on gas distribution components and each modular component has independent parameter control (e.g., RF or gas flow) to provide flexibility to control, for example, gas flow and/or RF exposure.

Figure 1:
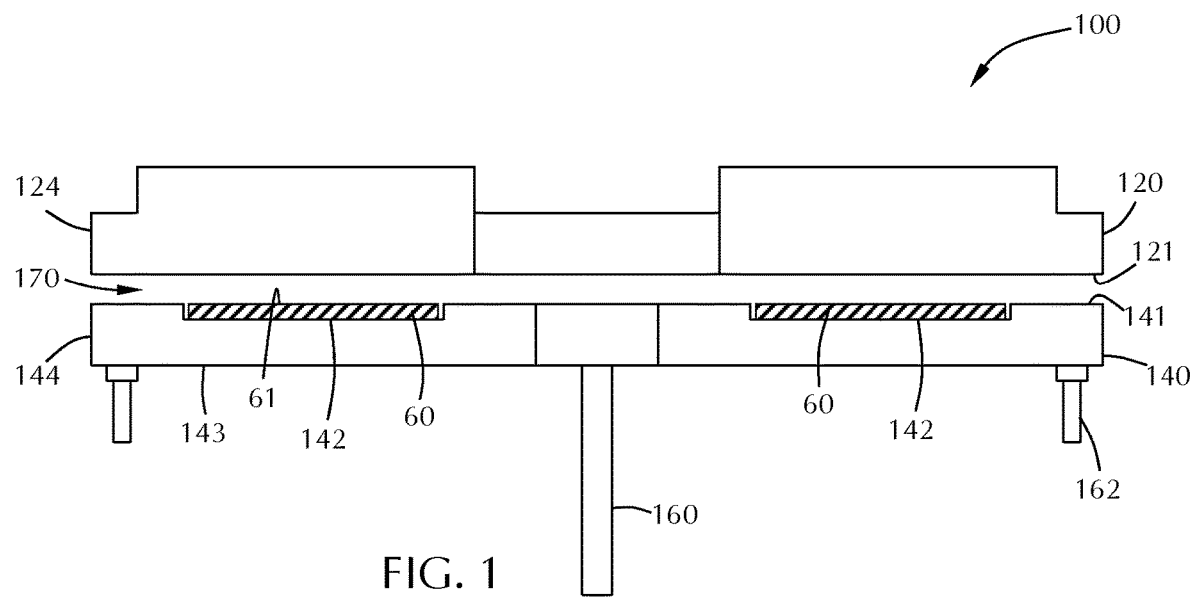
FIG. 1 shows a cross-sectional view of a batch processing chamber in accordance with one or more embodiment of the disclosure.

Embodiments of the disclosure are directed to apparatus and methods to provide enhanced chemical exchange in a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
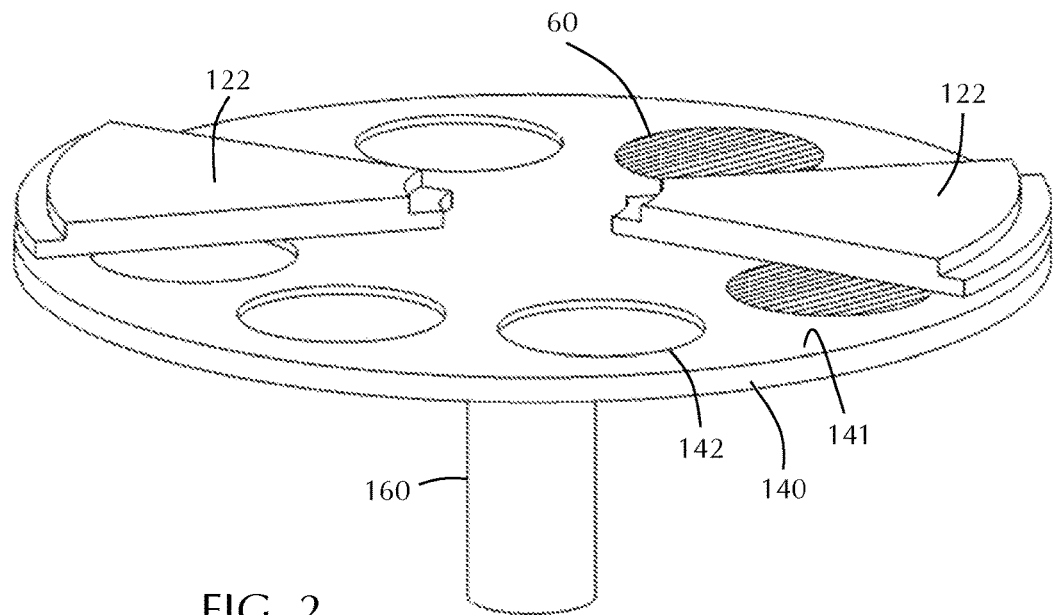
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.5 mm. In some embodiments, the top surfaces are coplanar within ±0.4 mm, ±0.3 mm, ±0.2 mm, ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
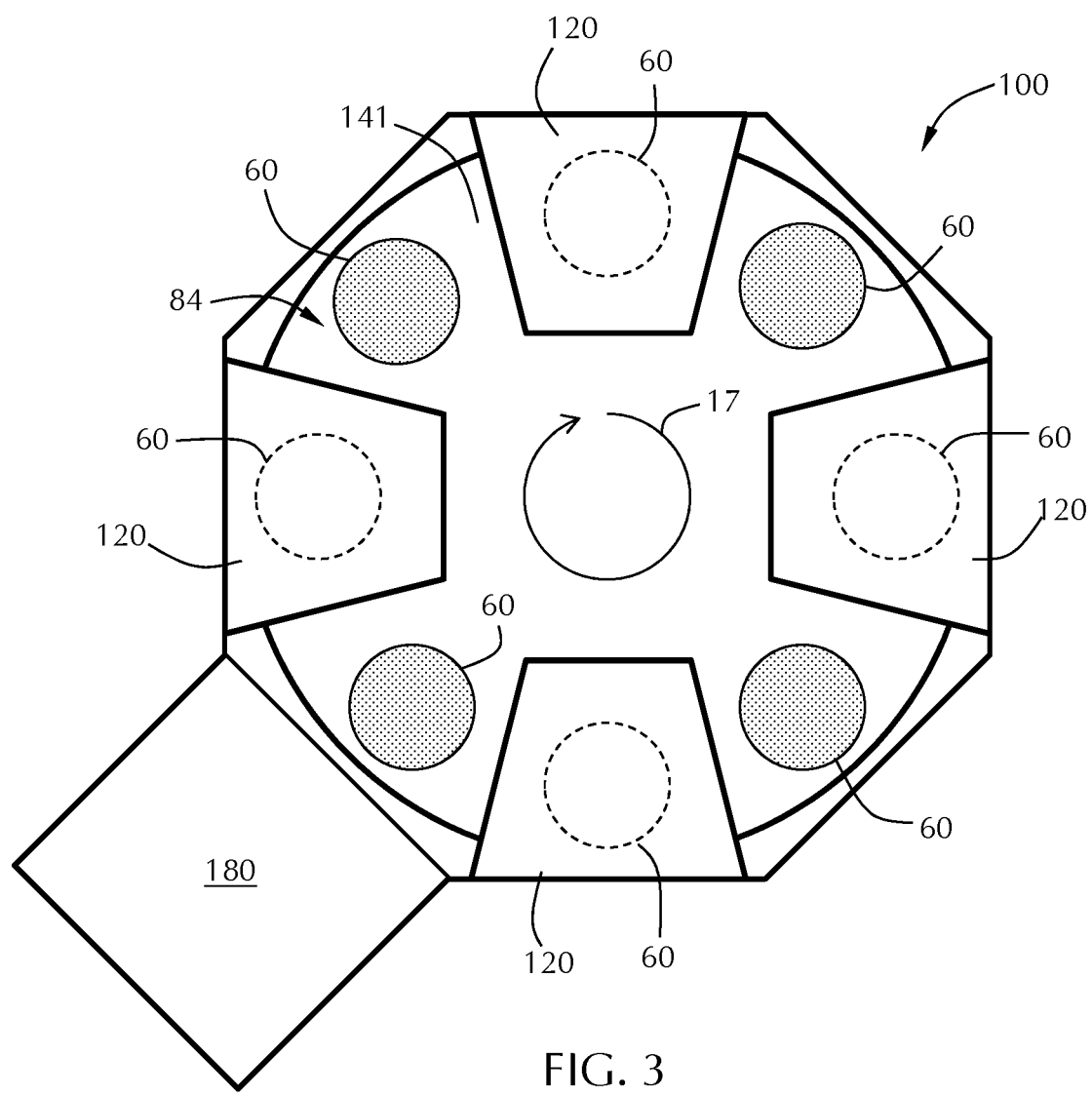
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the gas distribution assemblies 120. Rotating 17 the susceptor assembly 140 by 45° will result in each substrate 60 which is between gas distribution assemblies 120 to be moved to a gas distribution assembly 120 for film deposition, as illustrated by the dotted circle under the gas distribution assemblies 120. An additional 45° rotation would move the substrates 60 away from the gas distribution assemblies 120. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called gas distribution assemblies 120) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
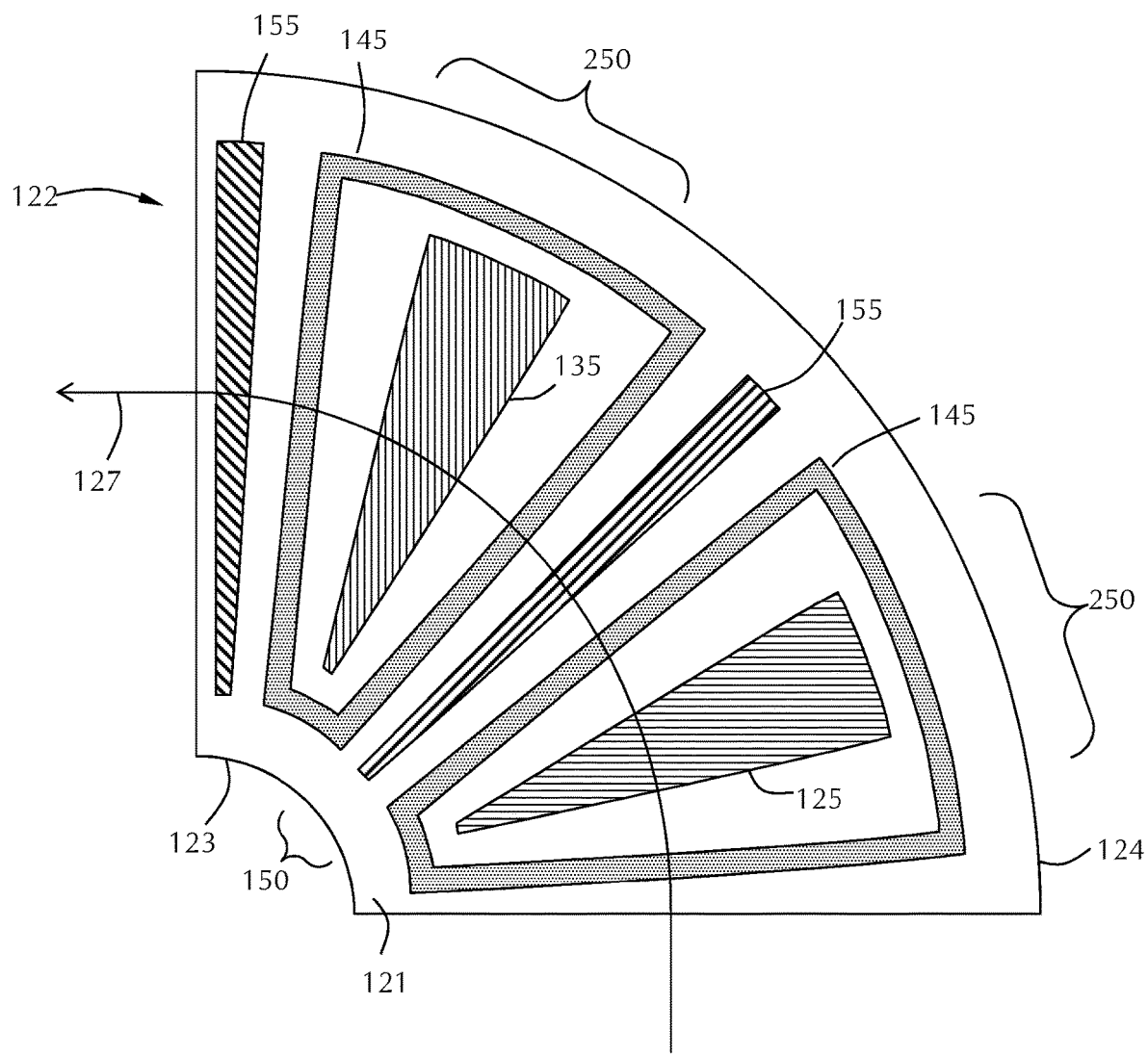
FIG. 4 shows a schematic view of a portion of a wedge shaped gas distribution assembly for use in a batch processing chamber in accordance with one or more embodiment of the disclosure.
Figure 5:
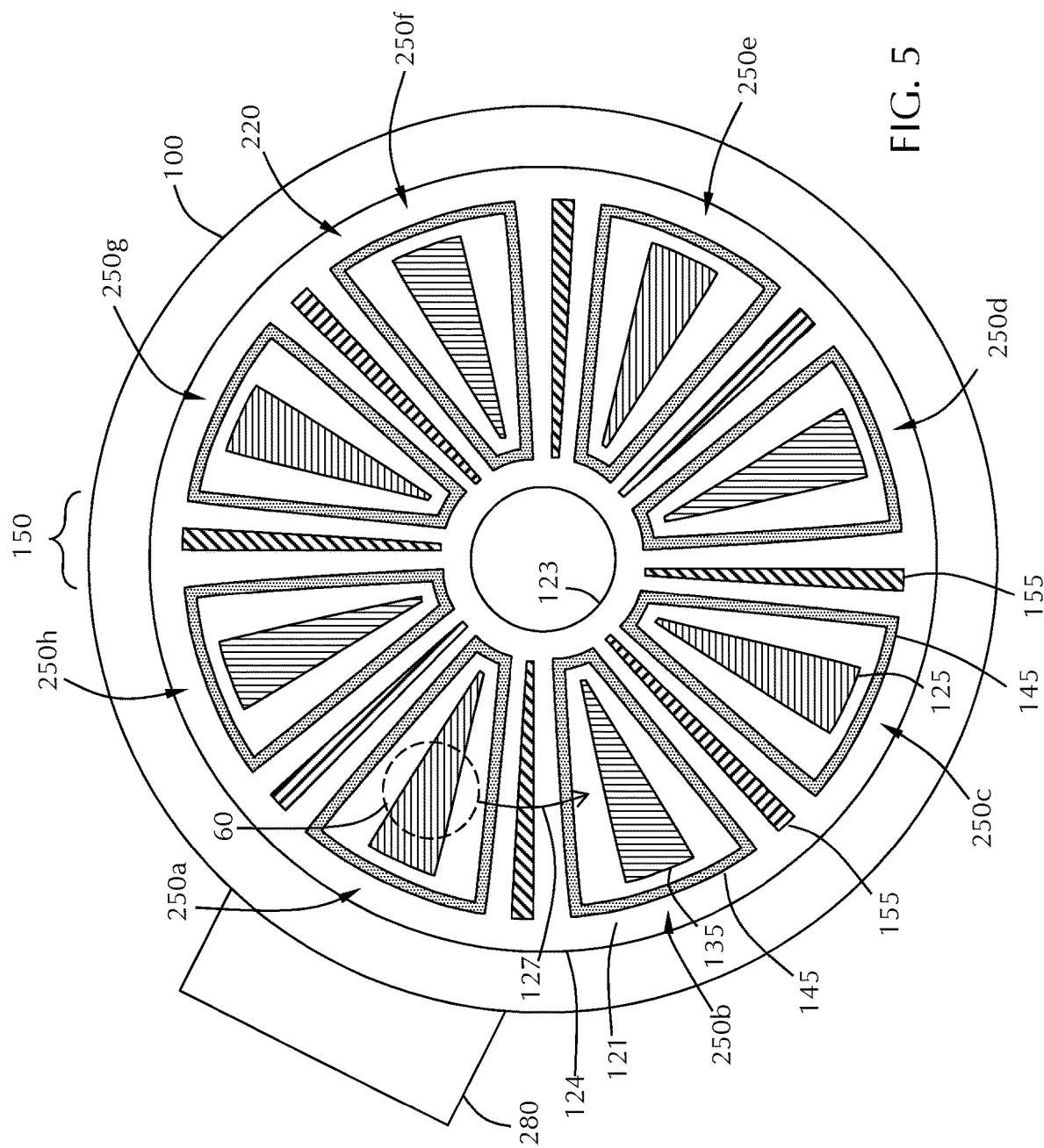
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and vacuum ports 145 in a front surface 121 of the gas distribution assembly 220. The plurality of elongate gas ports 125, 135, 155 and elongate vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas from the first reactive gas port 125 and the second reactive gas from the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series. The path 127 shown in FIG. 4 is represented as counter-clockwise; however, those skilled in the art will understand that the path can be reversed and/or the order of gas ports can be reversed.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process regions. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h. The number of gas curtains is generally equal to or greater than the number of process regions.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

A first reactive gas A is flowed into one or more of the process regions 250 while an inert gas is flowed into any process region 250 which does not have a first reactive gas A flowing into it. For example if the first reactive gas is flowing into process regions 250b through process region 250h, an inert gas would be flowing into process region 250a. The inert gas can be flowed through the first reactive gas port 125 or the second gas port 135.

The inert gas flow within the process regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the process regions easier by decreasing the differences in pressure between adjacent regions.

Accordingly, one or more embodiments of the disclosure are directed to processing methods utilizing a batch processing chamber like that shown in FIG. 5. A substrate 60 is placed into the processing chamber which has a plurality of process regions 250, each section separated from adjacent section by a gas curtain 150.

Some embodiments of the method comprise exposing a substrate surface having a feature thereon to a deposition environment to deposit a film. As used in this regard, a "deposition environment" comprises one or more process regions or process conditions that deposit a film.

Currently, there are little or no pressure fluctuations on the wafer surface as it traverses path 127, even when passing beneath the vacuum ports. For example, a 25 Torr process shows about a 0.16 Torr deviation in pressure across the gas ports. Chemical diffusion into device features is driven, as least in part, by concentration gradients. Without being bound by any particular theory of operation, it is believed that increasing the pressure in the reactive gas regions, or lowering the pressure in the vacuum regions can impact the chemical diffusion into the surface features (e.g., trenches and vias). Embodiments of the disclosure provide injectors that allow local pressure reduction relative to chemical exposure areas. Some embodiments provide injectors with larger exhaust areas to provide a local decrease in pressure. Some embodiments provide dedicated scavenging areas in addition to existing exhaust and purge curtain areas to cause a local decrease in pressure. Some embodiments provide a smaller gap against the wafer surface around the exhaust area to provide a local decrease in pressure. Some embodiments provide larger recessed volumes under chemical exposure areas to provide an increase in pressure in the reactive areas relative to the purge and exhaust areas.

Figure 6:
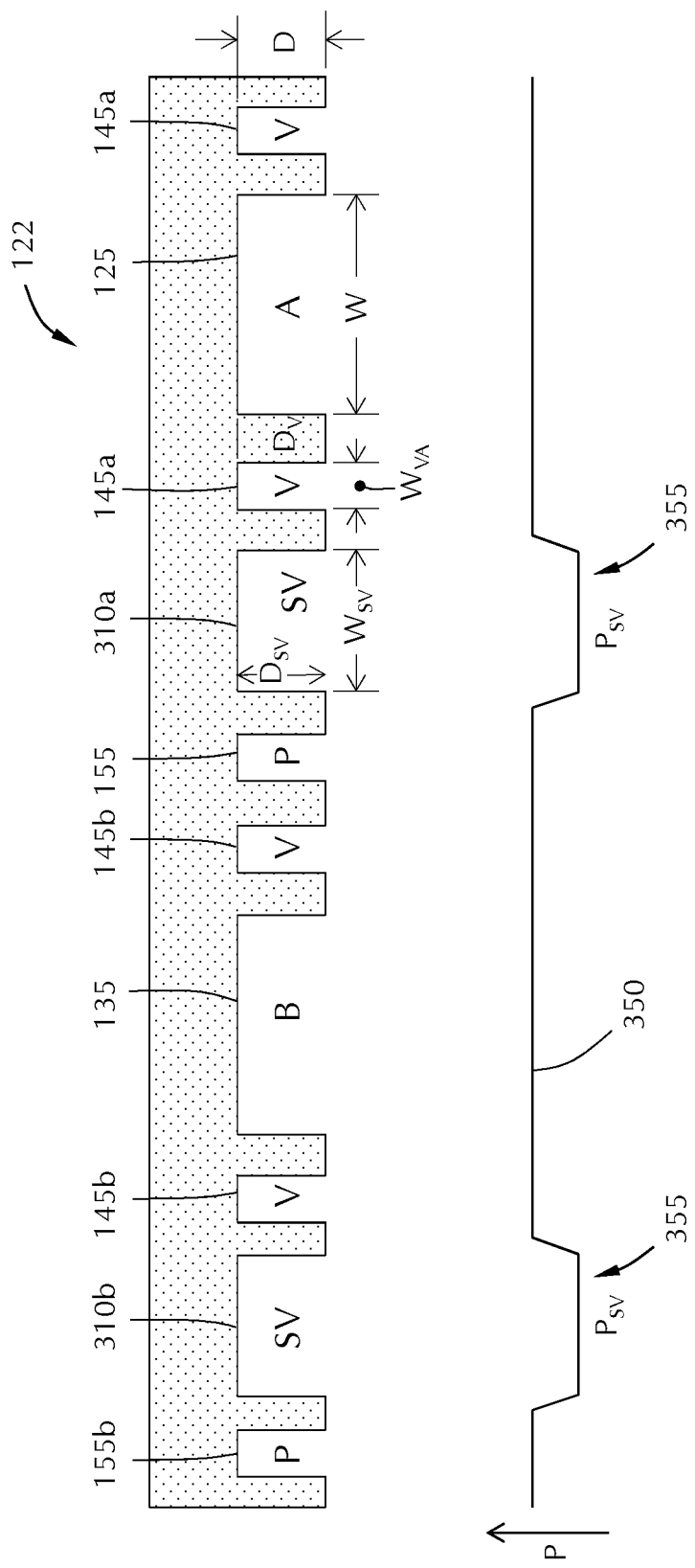
FIG. 6 shows a cross-sectional view of an injector unit in accordance with one or more embodiment of the disclosure.

FIG. 6 shows a cross-sectional view of an embodiment of a gas injector unit 122 taken along path 127 (shown in FIG. 4). A substrate might be processed by moving from right to left relative to the Figures. Those skilled in the art will understand that the order of ports and/or direction of travel can be changed. While a curved path is envisioned, those skilled in the art will appreciate that linear or irregular paths can also be followed.

Accordingly, one or more embodiments of the disclosure are directed to gas injector units 122 including a scavenging area with a stronger vacuum. Referring to FIG. 6, a gas injector unit 122 comprises a first reactive gas port 125 surrounded by a first vacuum port 145a. As used in this regard, the term "surrounded by" means that the vacuum port extends one either side of the reactive gas port. The vacuum port can be separate ports or a single port like that of FIG. 4. A second reactive gas port 135 is surrounded by a second vacuum port 145b. A purge gas port 155 is between the first vacuum port 145a and the second vacuum port 145b. Each of the first reactive gas port 125, second reactive gas port 135, first vacuum port 145a, second vacuum port 145b and purge gas port 155 have a depth D and a width W. The depth D of the gas ports is measured from the front surface 121 of the injector unit 122 to a back 129. The back 129 of the gas port is where the gas port meets the gas inlet and forms the major volume of the gas port.

A first scavenging vacuum port 310a is located between the first vacuum port 145a and the purge gas port 155. The first scavenging vacuum port 310a has a width $W_{SV}$ and depth $D_{SV}$. The first scavenging vacuum port 310a is located so that the substrate is exposed to the first scavenging vacuum port 310a after exposure to the reactive gas.

As shown in FIG. 6, some embodiments of the injector unit 122 includes a second purge gas port 155b adjacent the second vacuum port 145b on an opposite side of the second reactive gas port 135 than the first reactive gas port 125. A second scavenging vacuum port 310b may be positioned between the second vacuum port 145b and the second purge gas port 155b. The first scavenging vacuum port 310a acts to scavenge unwanted material from the chamber and substrate surface after exposure to the first reactive gas from the first reactive gas port 125 and the second scavenging vacuum port 310b acts to scavenge unwanted material from the chamber and the substrate surface after exposure to the second reactive gas from the second reactive gas port 135. In some embodiments, the substrate is moved in a direction equating to left-to-right in the Figures. When moving in this direction, the substrate is exposed to the scavenging port prior to exposure to the reactive gas port 125 or reactive gas port 135. In some embodiments, there is a scavenging vacuum port on both sides of the reactive gas ports.

In some embodiments, the first scavenging vacuum port 310a has a width $W_{SV}$ that is greater than the width of the first vacuum port $W_{VA}$. In some embodiments, the first vacuum port 145a has a width $W_{VA}$ in the range of about 1° to about 5°. The width of the ports is measured in degrees because the injector unit 122 is a portion of a circle and the width of a port at the inner peripheral edge is different from the width of the same port at the outer peripheral edge. The second scavenging vacuum port 310b can have a width that is greater than the width of the second vacuum port. While reference to the first scavenging vacuum port 310a is made, those skilled in the art will understand that the dimensions and pressures for the first scavenging vacuum port 310a can be the same as or different from the dimensions and pressures for the second scavenging vacuum port 310b.

In one or more embodiments, the width $W_{VA}$ of the first vacuum port 145a is in the range of about 1° to about 3°, or up to about 2°. The width $W_{SV}$ of the first scavenging vacuum port 310a in some embodiments is in the range of about 2° to about 25°. In some embodiments, the width $W_{SV}$ of the first scavenging vacuum port 310a is in the range of about 3° to about 20°, or in the range of about 4° to about 20°, or in the range of about 5° to about 30°, or in the range of about 10° to about 20°, or up to about 15°.

The width $W_{SV}$ of the first scavenging vacuum port 310a can be a ratio of the width $W_{VA}$ of the first vacuum port 145a. In some embodiments, the width $W_{SV}$ of the first scavenging vacuum port 310a is greater than or equal to about twice the width $W_{VA}$ of the first vacuum port 145a. In some embodiments, the width $W_{SV}$ of the first scavenging vacuum port 310a is 3×, 4×, 5×, 6×, 7×, 8×, 9× or 10× the width of the first vacuum port 145a.

The pressure $P_{SV}$ of the first scavenging vacuum port 310a can be lower than the pressure $P_{VA}$ of the first vacuum port 145a. In some embodiments, the first scavenging vacuum port 310a has the same width as the first vacuum port 145a and a lower pressure than the first vacuum port 145a. In some embodiments, the first scavenging vacuum port 310a is wider than the first vacuum port 145a and has a lower pressure. In some embodiments, the pressure $P_{SV}$ in the first scavenging vacuum port 310a is greater than or equal to about 1 Torr lower than pressure $P_{VA}$ in the first vacuum port 145a. In some embodiments, the pressure $P_{SV}$ of the first scavenging vacuum port 310a is lower than the pressure $P_{VA}$ in the first vacuum port 145 by an amount that is greater than or equal to 0.5 Torr, 1 Torr, 2 Torr, 3 Torr, 4 Torr, 5 Torr, 6 Torr, 7 Torr, 8 Torr, 9 Torr or 10 Torr. In some embodiments, the pressure PSV of the first scavenging vacuum port 145 is lower than the pressure PVA in the first vacuum port 145 by an amount greater than or equal to about 3%, 4%, 5%, 6%, 7%, 8%, 9% or 10% absolute.

The anticipated pressure effect 350 of the embodiment of FIG. 6 is shown below the injector unit 122. The anticipated pressure effect 350 has two regions of decreased pressure 355 adjacent the first scavenging vacuum port 310a and the second scavenging vacuum port 310b. The pressure remains substantially uniform for other locations adjacent the injector unit 122.

Figure 7:
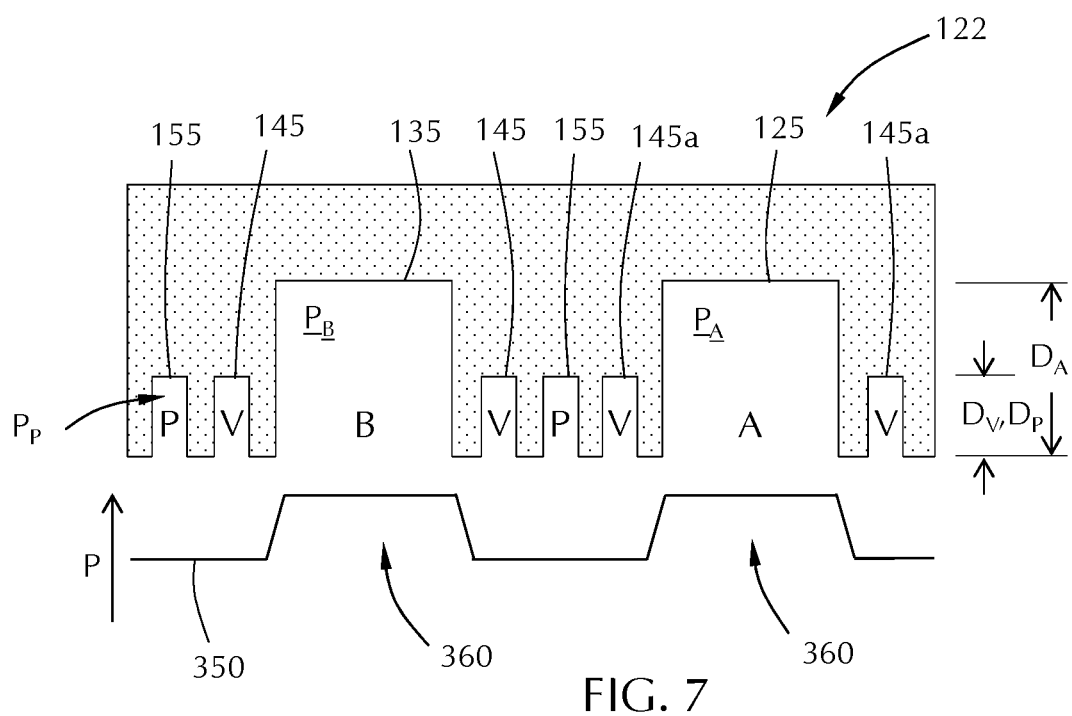
FIG. 7 shows a cross-sectional view of an injector unit in accordance with one or more embodiment of the disclosure.

FIG. 7 shows another embodiment of an injector unit 122 in which the depth $D_A$ of the first reactive gas port 125 is greater than the depth Dp of the purge gas port 155. The deeper reactive gas port 125, 135 allows for a greater pressure or concentration of reactive species adjacent the substrate surface. In some embodiments, the pressure $P_A$ in the first reactive gas port 125 is greater than the pressure Pp in the purge gas port 155. In some embodiments, the pressure $P_B$ in the second reactive gas port 135 is greater than the pressure $P_P$ in the purge gas port 155. The injector unit 122 can include one or more of different pressure gas ports and scavenging ports. The pressure in the reactive gas port can be greater than the pressure in the purge gas port by an amount greater than or equal to about 0.5 Torr, 1 Torr, 2 Torr, 3 Torr, 4 Torr, 5 Torr, 6 Torr, 7 Torr, 8 Torr, 9 Torr or 10 Torr.

The anticipated pressure effect 350 of the embodiment of FIG. 7 is shown below the injector unit 122. The anticipated pressure effect 350 has two regions of increased pressure 360 adjacent the first reactive gas port 125 and the second reactive gas port 135. The pressure remains substantially uniform for other locations adjacent the injector unit 122.

Figure 8:
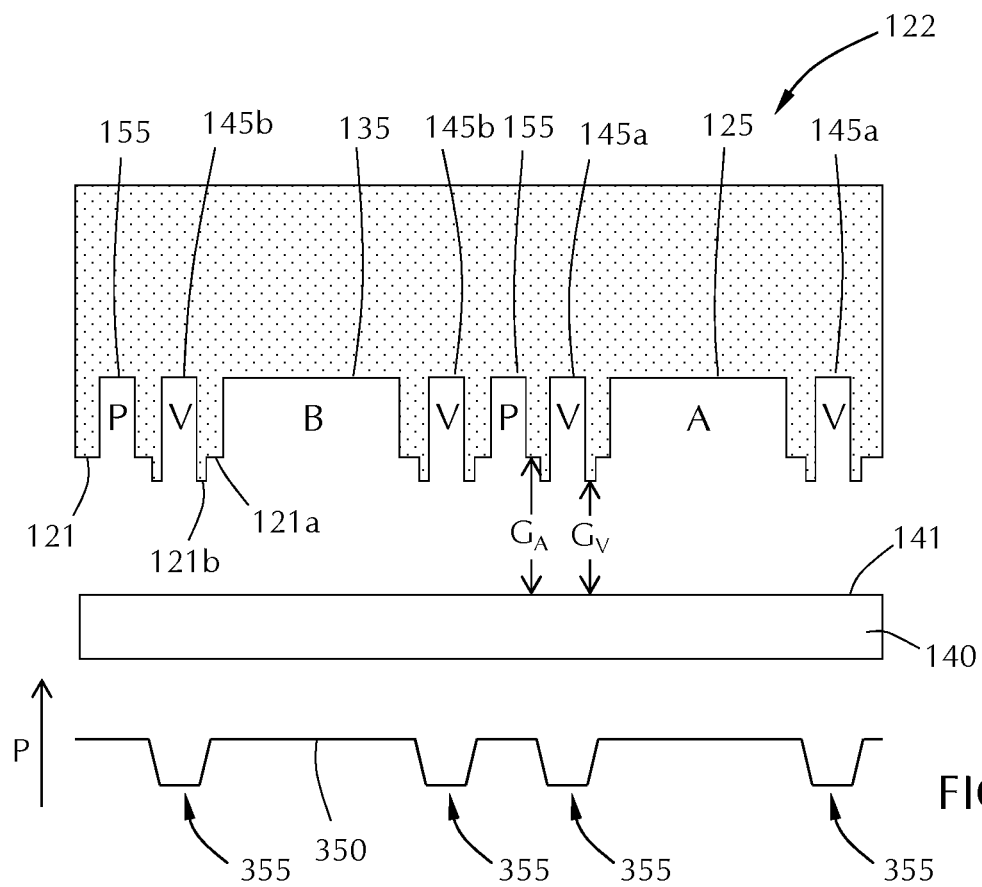
FIG. 8 shows a cross-sectional view of an injector unit in accordance with one or more embodiment of the disclosure.

FIG. 8 shows another embodiment of an injector unit 122 in which the front surface 121 of the injector unit 122 varies. The gap $G_V$ between the top surface 141 and the front surface 121 adjacent the first vacuum port 145a is different than the gap $G_A$ between the top surface 141 and the front surface 121a, 121b adjacent the purge gas ports 155.

In some embodiments, the difference in the gap $G_A$ and gap $G_V$ is greater than or equal to about 0.5 mm, 1 mm, 1.5 mm, 2 mm, 2.5 mm, 3 mm or more. Stated differently, the gap $G_V$ between the top surface 141 of the susceptor assembly 140 and the front surface 121 of the injector unit 122 adjacent the first vacuum port 145a and the second vacuum port 145b is greater than or equal to about 0.5 mm, 1 mm, 1.5 mm, 2 mm, 2.5 mm, 3 mm or more less than the gap $G_A$ adjacent the purge gas ports 155.

The anticipated pressure effect 350 of the embodiment of FIG. 8 is shown below the injector unit 122. The anticipated pressure effect 350 has four regions of decreased pressure 355 adjacent the vacuum ports 145a, 145b. The pressure remains substantially uniform for other locations adjacent the injector unit 122.

The injector unit 122 can include one or more of different pressure gas ports (as in FIG. 7), scavenging ports (as in FIG. 6) and variations in the front surface 121 (as in FIG. 8). Additionally, the location of the purge gas port 155b can be on either side of the injector unit 122 although it is shown on the left side in the Figures.

Figure 9:
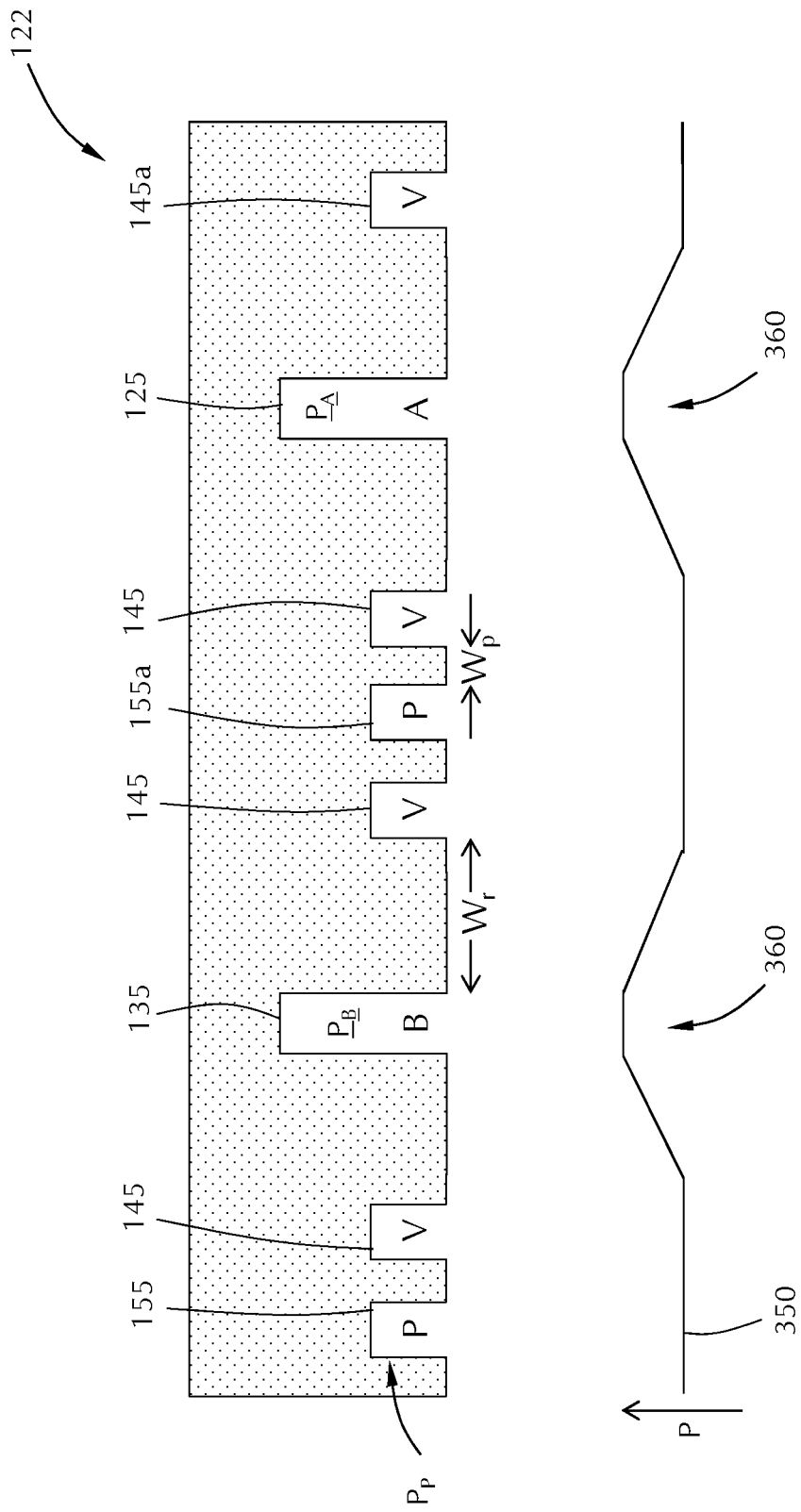
FIG. 9 shows a cross-sectional view of an injector unit in accordance with one or more embodiment of the disclosure.

FIG. 9 shows another embodiment of the disclosure in which there are narrow flow outlet openings over chemical exposure areas to provide an increase in local pressure in the reactive areas relative to the purge and exhaust areas. The first reactive gas port 125 and second reactive gas port 135 shown are narrow and located a greater distance $W_r$ from the vacuum port 145 than the purge gas port 155a is spaced from the vacuum port 145. The narrower reactive gas ports can have a higher pressure resulting in a larger pressure gradient between the reactive gas port and the vacuum port. In some embodiments, the opening of the reactive gas port is in the range of about 0.5 to about 3 degrees, or in the range of about 1 to about 2 degrees or about 1.5 degrees. The vacuum port 145 of some embodiments is in the range of about 2 to about 3 degrees. The distance $W_r$ between the reactive gas port 135 and the vacuum port 145 of some embodiments is in the range of about 5 degrees to about 15 degrees or in the range of about 7 degrees to about 13 degrees, or in the range of about 9 degrees to about 11 degrees or about 10 degrees. The distance $W_p$ between the purge gas port 155a and the vacuum port 145 is about 3 degrees to about 9 degrees, or in the range of about 5 degrees to about 7 degrees or about 6 degrees. In some embodiments, the distance $W_r$ is greater than or equal to about 1.5, 1.6, 1.7, 1.8, 1.9, 2.0, 2.1, 2.2, 2.3, 2.4, 2.5 or more time the distance $W_p$. In some embodiments, the pressure $P_B$ is greater than or equal to about 4%, 5%, 6%, 7%, 8%, 9% or 10% more than the pressure in purge gas port $P_P$.

Some embodiments are directed to a gas distribution assembly comprising a plurality of wedge-shaped gas injector units 122 forming a circular gas distribution assembly 120. One or more embodiments are directed to processing chambers incorporating the gas distribution assembly. Any combination of gas injector units 122 can be employed. For example, the gas distribution assembly 120 may be formed by four gas injector units 122 with scavenging ports like FIG. 6. In some embodiments, the gas distribution assembly 120 is formed from multiple injector units 122 with one or more of the injector units 122 having one or more of scavenging ports, different pressure gas ports and variations in the front surface.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a fixed amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before the second precursor is flowed. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A gas injector unit comprising:
a first reactive gas port having a depth and width;
a first vacuum port surrounding the first reactive gas port, the first vacuum port having a width and depth;
a second reactive gas port having a depth and width;
a second vacuum port surrounding the second reactive gas port, the vacuum port having a width and depth;
a purge gas port between the first vacuum port and the second vacuum port, the purge gas port having a width and depth; and
a scavenging vacuum port between the first vacuum port and the purge gas port, the scavenging vacuum port having a width and depth, wherein the scavenging vacuum port scavenges unwanted material after exposure to a first reactive gas from the first reactive gas port.

2. The gas injector unit of claim 1, wherein the width of the scavenging vacuum port is greater than the width of the first vacuum port.

3. The gas injector unit of claim 2, wherein the width of the first vacuum port is up to about 2°.

4. The gas injector unit of claim 2, wherein the width of the scavenging vacuum port is up to about 15°.

5. The gas injector unit of claim 2, wherein the width of the scavenging vacuum port is greater than or equal to about twice the width of the first vacuum port.

6. The gas injector unit of claim 2, wherein a pressure in the scavenging vacuum port is lower than a pressure in the first vacuum port.

7. The gas injector unit of claim 6, wherein the pressure in the scavenging vacuum port is greater than or equal to about 4% lower than in the first vacuum port.

8. The gas injector unit of claim 1, wherein the depth of the first reactive gas port is greater than the depth of the purge gas port.

9. The gas injector unit of claim 8, wherein a pressure in the first reactive gas port is greater than a pressure in the purge gas port.

10. The gas injector unit of claim 1, further comprising:
a second purge gas port adjacent the second vacuum port on an opposite side of the second reactive gas port than the first reactive gas port; and
a second scavenging vacuum port between the second vacuum port and the second purge gas port, the second scavenging vacuum port having a width and depth, wherein the second scavenging vacuum port scavenges unwanted material after exposure to a second reactive gas from the second reactive gas port.

11. The gas injector unit of claim 10, wherein the width of the scavenging vacuum port is greater than the width of the first vacuum port and the width of the second scavenging vacuum port is greater than the width of the second vacuum port.

12. A gas distribution assembly comprising a plurality of gas injector units according to claim 1 arranged to form a circle.

13. A processing chamber comprising:
a gas distribution assembly comprising a plurality of wedge-shaped gas injector units arranged in a circle, at least one of the wedge-shaped gas injector units comprising
a first reactive gas port surrounded by a first vacuum port,
a first scavenging vacuum port adjacent the first vacuum port on an opposite side than the first reactive gas port, a second reactive gas port surrounded by a second vacuum port, a second scavenging vacuum port adjacent the second vacuum port on an opposite side than the first reactive gas port, a purge gas port between the first scavenging port and the second reactive gas port, and a purge gas port adjacent the second scavenging vacuum port on a side opposite the second reactive gas port; and a susceptor assembly having a top surface with a plurality of recesses therein, the recesses sized to support a substrate, wherein the first scavenging vacuum port and the scavenges unwanted material after exposure to a first reactive gas from the first reactive gas port, and the second scavenging vacuum port scavenges unwanted material after exposure to a second reactive gas from the second reactive gas port.

14. The processing chamber of claim 13, wherein the first scavenging vacuum port has a width greater than a width of the first vacuum port and the second scavenging vacuum port has a width greater than the second vacuum port.

15. The processing chamber of claim 13, wherein a pressure in the first scavenging vacuum port is lower than a pressure in the first vacuum port and a pressure in the second scavenging vacuum port is lower than a pressure in the second vacuum port.

16. The processing chamber of claim 15, wherein the pressures in the first scavenging vacuum port and the second scavenging vacuum port are greater than or equal to about 1 Torr lower than the pressures in the first vacuum port and the second vacuum port.

* * * * *